United States Patent
Kalin et al.

(10) Patent No.: US 11,604,227 B2
(45) Date of Patent: Mar. 14, 2023

(54) METHOD AND CONTROL DEVICE FOR IMPEDANCE-BASED DETERMINATION OF A STATE OF CHARGE OF AT LEAST ONE BATTERY CELL AND MOTOR VEHICLE

(71) Applicant: AUDI AG, Ingolstadt (DE)

(72) Inventors: Dorothea Kalin, Munich (DE); Rolf Naumann, Michelau (DE); Christian Roettinger, Ingolstadt (DE)

(73) Assignee: AUDI AG, Ingolstadt (DE)

( * ) Notice: Subject to any disclaimer, the term of this patent is extended or adjusted under 35 U.S.C. 154(b) by 0 days.

(21) Appl. No.: 17/496,144

(22) Filed: Oct. 7, 2021

(65) Prior Publication Data

US 2022/0120816 A1 Apr. 21, 2022

(30) Foreign Application Priority Data

Oct. 15, 2020 (DE) ..................... 10 2020 127 259.6

(51) Int. Cl.
  *G01R 31/389* (2019.01)
  *G01R 31/392* (2019.01)
  *G01R 31/00* (2006.01)

(52) U.S. Cl.
  CPC ......... *G01R 31/389* (2019.01); *G01R 31/006* (2013.01); *G01R 31/392* (2019.01)

(58) Field of Classification Search
  None
  See application file for complete search history.

(56) References Cited

U.S. PATENT DOCUMENTS

| 2004/0128089 | A1 | 7/2004 | Barsoukov et al. |
| 2010/0295550 | A1* | 11/2010 | Hopper ............... H01M 10/448 |
| | | | 320/135 |
| 2015/0197159 | A1* | 7/2015 | Lee ........................ B60L 3/12 |
| | | | 903/903 |
| 2016/0069963 | A1* | 3/2016 | Hebiguchi ............ H01M 10/48 |
| | | | 324/430 |
| 2018/0275201 | A1 | 9/2018 | Oguma et al. |
| 2018/0321326 | A1* | 11/2018 | Tanaka ................ G01R 31/3833 |

FOREIGN PATENT DOCUMENTS

| DE | 10 2013 219 082 A1 | 3/2015 |
| DE | 10 2017 218 715 A1 | 4/2019 |
| EP | 1 480 051 A2 | 11/2004 |
| EP | 2 306 214 A2 | 4/2011 |

OTHER PUBLICATIONS

Examination Report dated Sep. 15, 2021 in corresponding German application No. 10 2020 127 259.6; 12 pages including Machine-generated English-language translation.

* cited by examiner

*Primary Examiner* — Jas A Sanghera
(74) *Attorney, Agent, or Firm* — Maier & Maier, PLLC

(57) ABSTRACT

A method for determining a state of charge of at least one battery cell, having the following steps to enable an improved determination of the state of charge of a lithium iron phosphate cell: generating an alternating current pulse in a circuit connected to the at least one battery cell, determining an impedance of the at least one battery cell on the basis of the alternating current pulse and determining the state of charge by comparing the impedance to predefined map data, wherein a relationship between the impedance and the state of charge of the at least one battery cell is determined from the predefined map data.

16 Claims, 2 Drawing Sheets

METHOD AND CONTROL DEVICE FOR IMPEDANCE-BASED DETERMINATION OF A STATE OF CHARGE OF AT LEAST ONE BATTERY CELL AND MOTOR VEHICLE

FIELD

The disclosure relates to a method for determining a state of charge of at least one battery cell, wherein in the method an alternating current pulse is generated in a circuit connected to the battery cell and the impedance of the battery cell is determined on the basis of the alternating current pulse. Moreover, the disclosure relates to a corresponding control device and a motor vehicle having such a control device.

BACKGROUND

Electrified vehicles, for example battery-electric vehicles, hybrid vehicles (parallel or sequential coupling of an internal combustion engine and an electric motor), or hydrogen-electric vehicles, each require an electrical energy storage device, in particular a so-called traction battery, for storing or temporarily storing electrical energy. The prior art is the use of lithium-ion cells. A major limiting factor in the spread of electrified vehicles is the high cost share of the electrical energy storage device. Lithium iron phosphate technology is emerging as a promising candidate within lithium-ion technology for reducing costs.

An electrical energy storage device or a traction battery typically consists of a large number of battery cells which are connected to one another in parallel and/or in series. By using lithium iron phosphate cells, the costs of the electrical energy storage device can be reduced in relation to the usable battery capacity. In addition, lithium iron phosphate cells can be more robust against external influences and thus improve the safety of an electrically operable motor vehicle.

A state of charge is usually determined, also referred to by the abbreviation SoC for "state of charge", derived from an open-circuit voltage state of charge characteristic. In the case of lithium iron phosphate cells, however, such an open-circuit voltage state of charge characteristic is on the one hand very flat and on the other hand has a high hysteresis. A determination of the state of charge on the basis of the voltage, in particular the open circuit voltage, is therefore not easily possible.

In the context of measurements on batteries, detecting a complex impedance of a battery at different temperatures or determining an internal impedance of a battery is known, for example, from US 2018/02 75 201 A1 and US 2004/01 28 089 A1.

A method and an apparatus for measuring a DC impedance of a battery cell by controlling charging of the battery cell are known from EP 2 306 214 A2. An available power or an available current can be calculated on the basis of the impedance.

SUMMARY

The object of the present disclosure is to enable an improved determination of the state of charge of a lithium iron phosphate cell.

A first aspect of the present disclosure is based on a method for determining a state of charge of at least one battery cell having the following steps:
  generating an alternating current pulse in a circuit connected to the at least one battery cell,
  determining an impedance of the at least one battery cell on the basis of the alternating current pulse, and
  determining the state of charge by comparing the impedance to predefined map data, wherein a relationship between impedance and the state of charge of the at least one battery cell is determined from the predefined map data.

For example, the alternating current pulse is a pulsating direct current that is generated in the circuit. This can be carried out, for example, by appropriately activating a time-variable load within the circuit. For this purpose, this load is in particular connected at least indirectly to both poles of the battery cell. For example, the alternating current pulse can be in a frequency range between 50 Hz and 500 kHz. In other words, such an alternating current is generated, for example, the frequency of which is between 50 Hz and 500 kHz. For example, the generation of the alternating current pulse can be triggered by a control device by outputting a command signal. It can thus be provided, for example, that the load is activated in the context of the method step mentioned in such a way that it triggers the alternating current pulse. Alternatively, an alternating current pulse present in any case can be used, which is not generated explicitly for the present method. In this case, an excitation present in any case in the circuit is used as the alternating current pulse to determine the impedance. As an alternative or additional method step, the alternating current pulse in the circuit is then detected in particular.

The impedance of the at least one battery cell can be determined on the basis of the alternating current pulse. For example, for this purpose a measurement of a current and/or a voltage takes place during the alternating current pulse within the circuit connected to the at least one battery cell. The voltage can be measured in parallel to the battery cell and/or in parallel to the load generating the alternating current. In addition, a phase shift between the measured current and the measured voltage can be determined or measured. If multiple voltages are measured, a respective phase shift can be measured or determined for each of the voltages. The complex impedance of the at least one battery cell can then be determined from the measured variables. For this purpose, at least two of the physical quantities listed below are used in particular: current in the circuit or through the at least one battery cell, voltage at the at least one battery cell, and/or phase shift between said current and said voltage. Instead of and in addition to the step of generating the alternating current pulse,
when determining the impedance, it is possible, in particular, to proceed in accordance with European patent application EP 1 480 051 A2. The determination of the impedance of at least one battery cell or a battery for the purpose of determining the high current load capacity of the battery is described in more detail therein.

The state of charge (SoC) can then be determined on the basis of the impedance or the complex impedance. In particular, the state of charge is indicated in percent, wherein the percentage proportion can be related here, for example, to an unusable gross capacity or usable net capacity of the at least one battery cell. Alternatively or additionally, the state of charge can be characterized by an amount of charge stored in the battery cell, for example in ampere hours, or by an amount of energy, for example in watt hours or kilowatt hours, wherein the remaining energy content in the at least one battery cell is load-dependent. A relationship between the impedance and the state of charge of the at least one battery cell is specified by the map data. The predefined relationship can, for example, have previously been determined experimentally. In particular, a respective value for the state of charge of the at least one battery cell is assigned by the map data of multiple values for the impedance. The map data can specify the relationship between the impedance as a complex variable and the state of charge. Alternatively, the map data can each independently of one another specify a relationship between the real part and the state of charge and between the imaginary part of the impedance and the state of charge. In some embodiments, it can alternatively be provided that the specified map data specify either the relationship between the real part and the state of charge or the relationship between the imaginary part and the state of charge.

It can thus be provided that a real part of the impedance is compared to real part data, wherein the real part data are part of the map data and wherein a respective value for the state of charge of the at least one battery cell is assigned by the real part data of multiple values for the real part of the impedance. Alternatively or additionally, it can be provided that an imaginary part of the impedance is compared to imaginary part data, wherein the imaginary part data are part of the map data and wherein a respective value for the state of charge of the at least one battery cell is assigned by the imaginary part data of multiple values for the imaginary part of the impedance.

It can thus be the case that the map data comprise both the real part data and the imaginary part data. Alternatively, it can be provided that the map data contain exclusively the real part data or exclusively the imaginary part data.

There are therefore the following exemplary possibilities: The map data comprise a characteristic map which quantifies the relationship between the impedance as a complex variable and the state of charge. The real part data can contain a real part characteristic map which quantifies the relationship between the real part of the impedance and the state of charge. The imaginary part data can contain an imaginary part characteristic map which quantifies the relationship between the imaginary part of the impedance and the state of charge of the at least one battery cell. Of course, several of the examples mentioned can also be combined in respective embodiments of the present disclosure: The characteristic map with respect to the complex impedance can be used together with the real part characteristic map and/or the imaginary part characteristic map to determine the state of charge. In one preferred embodiment, the state of charge is determined on the basis of the real part data or the real part characteristic map together with the imaginary part data or the imaginary part characteristic map.

Overall, by determining the state of charge of the at least one battery cell by measuring the impedance and then comparing it to the map data or the respective characteristic map, a particularly simple and precise possibility for determining the state of charge is created.

According to one refinement, it is provided that an equivalent circuit diagram of the at least one battery cell is used to determine the impedance, which includes a parallel connection of a capacitor and a first resistor and a second resistor in series with said parallel connection. In other words, the determination of the impedance is based on an equivalent circuit diagram for the at least one battery cell, wherein the second resistor is connected in series with a parallel connection of the capacitor and the first resistor in the equivalent circuit diagram. Such an equivalent circuit diagram allows the electrical properties of the at least one battery cell to be approximated in a particularly simple and comprehensive manner. The capacitor corresponds in particular to the imaginary part of the impedance, whereas the first resistor and the second resistor correspond in particular to the real part of the impedance. In particular, an electrical capacitance C of the capacitor can be determined on the basis of the imaginary part of the impedance. In particular, a total ohmic resistance of the resistors, thus of the first and second resistor together, can be determined on the basis of the real part of the impedance. It can thus be provided that the map data, in particular the real part data, are embodied as a resistance-state of charge characteristic map or include such a resistance-state of charge characteristic map. In this case, the state of charge of the at least one battery cell can be determined on the basis of the joint resistance of the first and second resistor. Alternatively or additionally, it can be provided that the map data or the imaginary part data comprise a capacitance-state of charge characteristic map or are designed as such a capacitance-state of charge characteristic map. In this case, the state of charge can be determined from the capacitance C of the capacitor on the basis of the capacitance-state of charge characteristic map.

According to one refinement, it is provided that the predetermined map data define at least one calibration point within a curve of the impedance. The calibration point can preferably be a particularly representative point within the characteristic map. In particular, within the calibration point, a particularly steep curve of an underlying characteristic of the respective characteristic map is defined in comparison to its surroundings. It follows from this that the state of charge can be determined with particularly high accuracy at such a calibration point. It is therefore provided that an additional detection of the state of charge is calibrated by means of current integration when the calibration point is exceeded. It can generally be provided that, in addition to determining the state of charge on the basis of the impedance, the additional determination of the state of charge is carried out by means of current integration. The current flowing in each case is integrated, wherein this method of determination calculates the state of charge from the total amount of charge withdrawn since the last calibration. It is thus integrated over the entire current since the last calibration, from which the amount of charge withdrawn since the last calibration results. Due to increasing inaccuracies in the additional detection of the state of charge by means of current integration, regular, in particular particularly frequent, calibration is necessary. According to the present refinement of the disclosure, it is provided that such a calibration takes place each time the calibration point is exceeded within the map data or within a respective characteristic map of the map data, since a particularly precise determination of the state of charge based on the impedance is possible at the calibration point. The curve of the imaginary part of the impedance is particularly suitable for this purpose, since this often has a particularly characteristic curve.

In particular, the at least one calibration point is a local or absolute maximum of an electrical capacitance C, wherein the local or absolute maximum of the capacitance is at, for example, between 70% and 90%, in particular approximately 80% state of charge of the at least one battery cell. This refinement is based on the finding that the electrical capacitance C frequently has a narrow-band maximum, either local or absolute, in the stated range of the state of charge. In other words, the local or absolute maximum of the electrical capacitance in the imaginary part data or in the imaginary part state of charge characteristic map is used as a calibration point. Due to its particularly characteristic and narrow-band curve, a particularly precise calibration of the current integration is possible as a result. In particular, the electrical capacitance is represented in the equivalent circuit diagram by the capacitor. In relation to the equivalent circuit diagram, a capacitance maximum of the capacitor is used as the calibration point, wherein the capacitance of the capacitor is dependent on the state of charge.

According to one refinement, it is provided that the impedance is compared to aging map data in addition to the map data, wherein the aging map data indicate a change in the relationship between the impedance and the state of charge due to aging and/or the number of cycles of the at least one battery cell. This refinement is based on the concept that the relationship between impedance and state of charge can change with advancing aging or the number of cycles of the at least one battery cell. This can be taken into consideration by the additional aging map data. In particular, an internal resistance of the at least one battery cell changes with advancing aging and/or the number of cycles. The changes can therefore particularly affect the real part of the impedance. In relation to the equivalent circuit diagram, this can be taken into consideration in that an aging-related and/or cycle-related increase in the resistance of the battery cell, that is to say the first and second resistor in the equivalent circuit diagram, is determined and taken into consideration. In this way, the state of charge can be determined as precisely as possible even with progressing aging and/or the number of cycles of the at least one battery cell.

In particular, it is provided that the aging map data are derived from a direct current resistance of the at least one battery cell. The direct current resistance allows conclusions to be drawn in a particularly simple manner about the change in the internal resistance of the at least one battery cell, that is to say the first and second resistor in the equivalent circuit diagram. It is thus provided that the direct current resistance of the at least one battery cell is determined. The aging map data can then be derived on the basis of the direct current resistance. The aging map data can be used or taken into consideration in addition to the map data when determining the impedance. In particular, when the state of charge is determined on the basis of the map data, the aging-related increase in the direct current resistance is compensated for or taken into consideration on the basis of the aging map data.

Starting from the direct current resistance or a change of the direct current resistance, a temperature-dependent and/or state-of-charge-dependent characteristic map can be determined which, as part of the aging map data, indicates or quantifies the change in the relationship between impedance and state of charge. Such a temperature-dependent and/or state-of-charge-dependent characteristic map takes into consideration that the change in the internal resistance or direct current resistance of the at least one battery cell can be dependent on the temperature of the battery cell and/or the state of charge of the at least one battery cell. The temperature-dependent and/or state-of-charge-dependent characteristic map can be determined by extrapolation from a measured value of the direct current resistance at a certain temperature and/or a certain state of charge of the at least one battery cell. A higher level of accuracy can be achieved if the characteristic map is extrapolated on the basis of several measuring points at different temperatures and/or states of charge. This is possible, for example, when the electrified motor vehicle equipped with the at least one battery cell starts to drive, since the at least one battery cell heats up considerably within a shorter period of time in this case. The direct current resistance for different temperature values can thus be determined by successive measurements after a cold start of the motor vehicle. Similarly, this can be done with fast charging for a large number of different states of charge and temperatures. Overall, by generating such a temperature-dependent and/or power-dependent characteristic map, aging and/or the number of cycles of the at least one battery cell can be taken into consideration particularly well.

A second aspect of the present disclosure relates to a control device for determining a state of charge of at least one battery cell, having:

an output unit for outputting a command signal for generating an alternating current pulse in a circuit connected to the at least one battery cell and/or a detection unit for detecting the alternating current pulse in the circuit, and a determination unit for determining an impedance of the at least one battery cell on the basis of the alternating current pulse, wherein the determination unit is designed to determine the state of charge by comparing the impedance to predefined map data, wherein a relationship between the impedance and the state of charge of the at least one battery cell is determined from the predefined map data.

The control device can have a data processing device or a processor unit which is configured to carry out an embodiment of the method according to the disclosure. For this purpose, the processor unit can have at least one microprocessor and/or at least one microcontroller and/or at least one FPGA (Field Programmable Gate Array) and/or at least one DSP (Digital Signal Processor). Furthermore, the processor unit can have program code which is configured to carry out the embodiment of the method according to the disclosure when it is executed by the processor unit. The program code can be stored in a data memory of the processor unit.

A third aspect of the present disclosure relates to a motor vehicle having the control device according to the disclosure, the at least one battery cell, the circuit connected to the at least one battery cell, and an electrical load which is designed to generate the alternating current pulse in the circuit connected to the at least one battery cell in response to the command signal. In particular, the electrical load is arranged in the circuit connected to the at least one battery cell or is electrically conductively connected to the at least one battery cell via the circuit.

According to one refinement it is provided that the at least one battery cell is designed as a lithium iron phosphate cell. As already described in the introduction, a lithium iron phosphate cell often has a particularly flat voltage-state of charge characteristic with large hysteresis. For this reason, the method according to the disclosure and the control device according to the disclosure are particularly suitable for determining the state of charge of such a lithium iron phosphate cell. The at least one battery cell is preferably an electrical energy storage device or a traction battery. In the electrical energy storage device or the traction battery, a large number of lithium iron phosphate cells are electrically connected to one another in parallel and/or in series. For example, the state of charge is determined for a plurality of the battery cells or lithium iron phosphate cells individually and/or for the entire electrical energy storage device or the entire traction battery at electrical contacts that are externally applied to the electrical energy storage device or the traction battery.

The disclosure also includes refinements of the control device according to the disclosure and the motor vehicle according to the disclosure, which have features as already described in the context of the refinements of the method according to the disclosure. For this reason, the corresponding refinements of the control device according to the disclosure and the motor vehicle according to the disclosure are not described again here.

The motor vehicle according to the disclosure is preferably designed as an automobile, in particular as a passenger car or truck, or as a passenger bus or motorcycle. The motor vehicle is preferably an electrified motor vehicle, for example a battery-electric motor vehicle, a hybrid vehicle (parallel or sequential coupling of an internal combustion engine and an electric motor), or a hydrogen-electric motor vehicle. In such an electrified motor vehicle, the at least one battery cell is preferably designed to supply at least one electric drive or an electric motor of the motor vehicle with electrical energy.

The disclosure also comprises combinations of the features of the described embodiments. The disclosure therefore also comprises implementations which each have a combination of the features of multiple of the described embodiments, unless the embodiments have been described as mutually exclusive.

BRIEF DESCRIPTION OF THE FIGURES

Exemplary embodiments of the disclosure are described hereinafter. In the figures.

DETAILED DESCRIPTION

The exemplary embodiments explained hereinafter are preferred embodiments of the disclosure. In the exemplary embodiments, the described components of the embodiments each represent individual features of the disclosure to be considered independently of one another, which each also refine the disclosure independently of one another. Therefore, the disclosure is also intended to comprise combinations of the features of the embodiments other than those shown. Furthermore, the described embodiments can also be supplemented by further features of the disclosure that have already been described.

In the figures, the same reference signs designate elements that have the same function.

Figure 1:
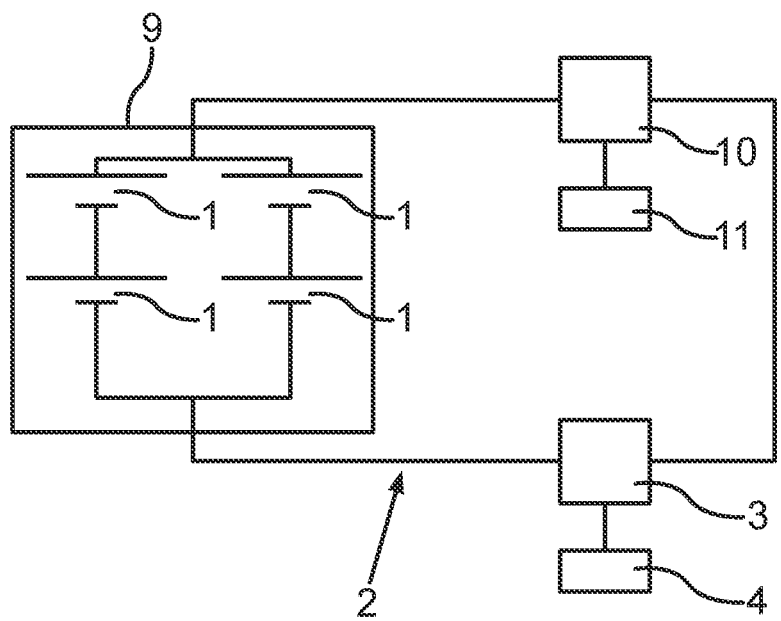
FIG. 1 shows an exemplary embodiment of a circuit in a motor vehicle having a lithium iron phosphate battery in a block diagram.

FIG. 1 shows an exemplary circuit 2. In the present example, the circuit 2 is part of a motor vehicle. In the present case, the circuit 2 is designed to supply electrical components of the motor vehicle with electrical energy. The motor vehicle is in particular an electrified motor vehicle, for example a battery-electric motor vehicle, a hybrid vehicle (parallel or sequential coupling of an internal combustion engine and an electric motor), or a hydrogen-electric motor vehicle. In the present case, the circuit 2 is used to supply an electric machine 11 or an electric motor 11 for driving the motor vehicle with electrical energy. The circuit 2 can be designed as a high-voltage circuit for this purpose.

A traction battery 9, which is arranged in the circuit 2, is thus designed to supply the electric machine 11 with electrical energy via the circuit 2. The traction battery 9 is preferably designed as a high-voltage battery. In particular, the traction battery 9 therefore has a voltage level of at least 80 V, preferably more than 200 V, for example approximately 400 V or 800 V. In the present example, a power converter or converter 10 is provided in order to convert the electrical energy according to the requirements of the electric machine 11. For example, the converter 10 is designed to convert a direct current from the traction battery 9 into an alternating current, preferably three-phase alternating current.

Furthermore, the circuit 2 can be designed to supply an on-board network of the motor vehicle with electrical energy. In the present example, this takes place via an on-board power supply converter 12. For example, the on-board power supply converter 12 is designed to reduce a voltage of the traction battery 9 or circuit 2 to an on-board power supply voltage, for example 12 V or 24 V or 48 V.

The traction battery 9 has a large number of battery cells 1. The battery cells 1 can be connected in the interior of the traction battery 9 in an electrical parallel and/or series connection. In the present case, multiple battery cells 1 are connected in series to one another and multiple such series circuits are connected in parallel to one another. The battery cells 1 are lithium iron phosphate cells. In other words, battery cells 1 are each based on the cell chemistry of a lithium iron phosphate cell. Accordingly, the traction battery 9 can be referred to as a lithium iron phosphate battery.

Figure 4:
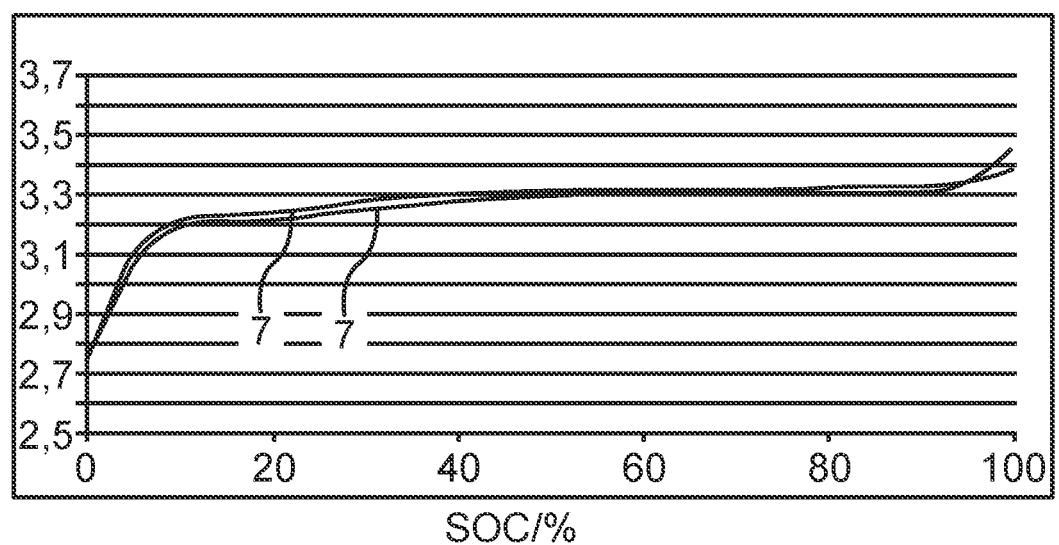
FIG. 4 shows respective exemplary voltage-state of charge characteristics of a lithium iron phosphate battery cell in the charging and discharging directions.

FIG. 4 shows exemplary voltage-state of charge characteristics 7 of a lithium iron phosphate cell at room temperature (25° C.) in the charge and discharge directions. These show an extremely flat curve, in particular between 40% and 90%. In addition, the lithium iron phosphate cells have a large hysteresis in the dependency between voltage and state of charge. The voltage is in particular the open circuit voltage of the respective cell (called "open circuit voltage", abbreviated "OCV") in volts. The state of charge, denoted here with the abbreviation "SoC" for "state of charge", is usually indicated in percent. Overall, it can be seen from FIG. 4 that it is not possible to reliably determine the state of charge or SoC on the basis of the characteristics 7.

Figure 2:
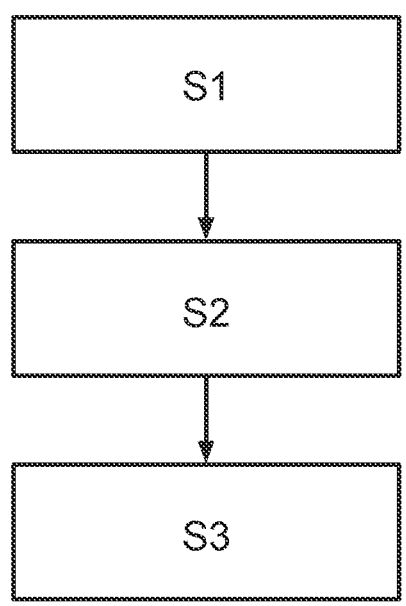
FIG. 2 shows a flow chart of an exemplary embodiment of a method for determining a state of charge of a battery.

The state of charge is therefore determined in the present case by means of an alternative method based on an impedance of the at least one battery cell 1 or the traction battery 9. Referring again to FIG. 1, a control device 4 is provided in the present case. The control device 4 is designed in particular to determine the state of charge of at least one battery cell 1 or of the traction battery 9. The control device is preferably designed to carry out a method for determining a charging current of at least one battery cell, as is shown in FIG. 2.

In a first step S1 of the method, an alternating current pulse is generated in the circuit 2. This can be done by generating a direct current pulse in the circuit 2. The alternating current pulse can thus be based on a pulsating direct current. An underlying frequency can be between 50 Hz and 500 kHz, for example. For example, the alternating current pulse is generated by an electrical load 3 in the circuit 2. In other words, the electrical load 3 can be designed to generate the alternating current pulse. The electrical load 3 can be provided specifically for generating the alternating current pulse. In this case, the electrical load 3 is a separate component which, in particular, has no further purpose. Alternatively, the electrical load 3 can be provided by another electrical component in the circuit 2. For example, the electrical load 3 can be provided by the power converter 10 or the on-board power supply converter 12. In this case, for example, the power converter 10 or the on-board power supply converter 12 is designed to generate the alternating current pulse. In this case, no separate component is necessary as an electrical load 3 for generating the alternating current pulse. Any other electrical component that is electrically connected to the at least one battery cell 1 can also be used for this purpose.

data or imaginary part data for different temperatures and/or different values of the further parameters.

Such a characteristic is shown in extracts for a specific example in the following on the basis of individual values. The exemplary values in the following table apply for room temperature (25° C.):

| Ri | 0.063 | 0.045 | 0.046 | 0.045 | 0.044 | 0.043 | 0.042 | 0.041 | 0.043 | 0.043 | 0.047 |
|----|-------|-------|-------|-------|-------|-------|-------|-------|-------|-------|-------|
| R1 | 0.100 | 0.095 | 0.108 | 0.084 | 0.066 | 0.056 | 0.046 | 0.041 | 0.044 | 0.043 | 0.901 |
| C1 | 1459 | 1459 | 1577 | 1498 | 1381 | 1429 | 1362 | 1316 | 1946 | 1366 | 136 |
| SoC | 0% | 10% | 20% | 30% | 40% | 50% | 60% | 70% | 80% | 90% | 100% |

The alternating current pulse is generated in particular in response to a corresponding command signal of the control device 4. For example, the control device 4 has for this purpose a corresponding output unit for outputting such a command signal. The output unit can be designed to output the command signal to the electrical load 3 or the power converter 10 or the on-board power supply converter 12. In general, the control device 4 can be configured to command the electrical load 3, regardless of whether it is provided separately or by another component, to generate the alternating current pulse.

In a step S2 of the method, the impedance of the at least one battery cell 1 or the traction battery 9 is determined on the basis of the alternating current pulse. For this purpose, for example, the current (Delta_I) in the circuit 2 and the voltage (Delta_U) at the at least one battery cell 1 or the traction battery 9 are determined. In addition, a phase offset between current and voltage can be determined. The impedance results from the two variables. In addition, reference is made in particular to EP 1 480 051 A2, in which the determination of the impedance is described in more detail. For example, the impedance is determined as a complex variable. In this case, the impedance can be composed of a real part and an imaginary part. Alternatively or additionally, the real part and the imaginary part can each be determined as real variables. The real part represents in particular an ohmic resistance in the circuit 2, in particular an ohmic resistance of the at least one battery cell 1 or traction battery 9. The imaginary part represents in particular a capacitive or inductive impedance in the circuit 2, in particular a capacitive or inductive impedance of the at least one battery cell 1 or traction battery 9.

Figure 3:
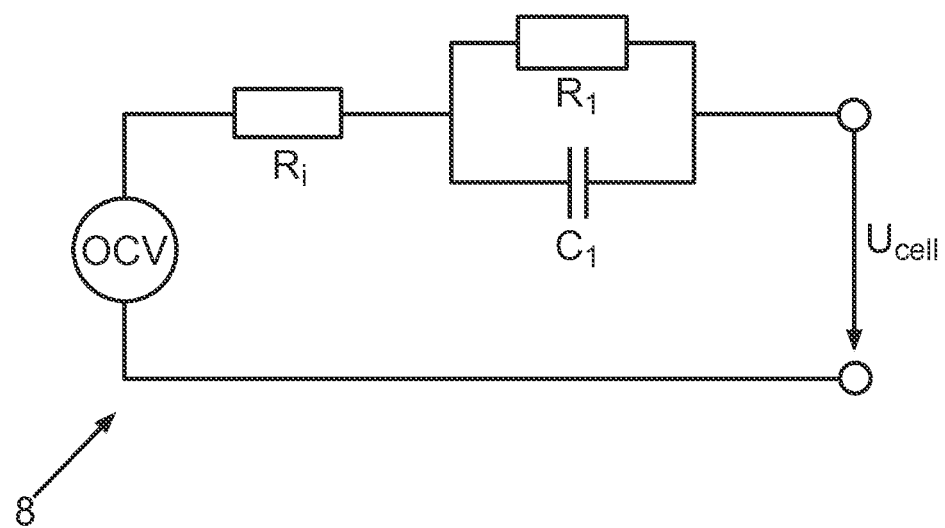
FIG. 3 shows an exemplary equivalent circuit diagram of a battery or a battery cell.

In a step S3 of the method, the state of charge of the at least one battery cell 1 or of the traction battery 9 is determined on the basis of the impedance. This is done in particular by comparing the impedance to predefined map data, wherein a relationship between the impedance and the state of charge of the at least one battery cell 1 or the traction battery 9 is determined from the predefined map data. For example, the map data can have or contain real part data and imaginary part data. The real part of the impedance can be compared to the real part data and/or the imaginary part of the impedance to the imaginary part data. The real part data and/or the imaginary part data can contain a respective characteristic which describes or specifies the relationship between the real part or the imaginary part and the state of charge. The respective characteristic can be determined or can have been determined beforehand, for example in the laboratory. The respective characteristic of the real part data and/or imaginary part data can be temperature-dependent and/or dependent on further parameters. In this case, a respective characteristic can be contained in the real part The values relate to an equivalent circuit diagram 8 of a battery cell 1, as shown in FIG. 3. The battery cell 1 is represented in the exemplary equivalent circuit diagram 8 by an ideal voltage source OCV, a parallel connection of a first (ohmic) resistor R1 and a capacitor C1, and a second (ohmic) resistor Ri, which is connected in series to the parallel connection. In individual cases, the values mentioned can of course vary greatly depending on the cell. According to the table above, the resistances Ri and R1 are indicated in ohms and the capacitance C1 in µF. The resistances Ri and R1 jointly correspond to the real part of the impedance and the capacitance C1 to the imaginary part of the impedance.

What is noticeable in the table above is the narrow-band maximum of the capacitance C1 at 80% state of charge. This narrow-band maximum enables the state of charge (SoC) to be determined with a particularly high degree of accuracy in the range around 80% on the basis of the capacitance C1 or on the basis of the imaginary part of the impedance. The range around the maximum of the capacitance C1 is therefore referred to or used as calibration points. In particular, an additional determination of the state of charge can be reset or calibrated by current integration upon each passage through the calibration point. In particular, the state of charge, in addition to its determination on the basis of the impedance, is also progressively determined by current integration. In order to avoid or reduce a progressive deviation in this determination method, regular calibration or regular resetting of the current integration is necessary. This is preferably done regularly or whenever the state of charge exceeds the calibration point.

In order to take into account a progressive aging of the at least one battery cell 1 or the traction battery 9, a change of the internal resistance (represented by Ri and R1 in equivalent circuit diagram 8) is also taken into consideration. This is done in particular by additionally taking aging map data into consideration. To create the aging map data, the internal resistance can be regularly determined or measured. The increase in the internal resistance in comparison to a basic state or a new state can be determined by subtracting a value for the internal resistance in the new state from the value for the internal resistance in the present state. This increase of the resistance can be dependent on the temperature (of the respective battery cell 1) and/or the state of charge. Starting from a value for the increase of the internal resistance, the entire characteristic map can be extrapolated for other state of charge and/or temperatures in accordance with a predetermined curve. This is based on the finding that the change or increase of the internal resistance depends on the temperature and/or the state of charge, but usually follows a fixed relative curve.

The internal resistance or an aging factor derived from it as part of the aging map data can be determined in different ways:

Determining DC Resistance with Known State of Charge

In driving operation, the internal resistance of battery cell 1 or traction battery 9 can be determined, for example via Delta_U/Delta_I, at suitable points, for example current zero crossing (R_calc). If this happens at a point where the exact state of charge is currently known (for example at the calibration point based on C1), this can be used to determine the aging factor.

From such a measurement of the battery cell 1, it is furthermore known to what extent this DC resistance corresponds to the Ri and R1 from the equivalent circuit diagram 8. As a result, the aging factor by which the table values differ from the measured value R_calc can be determined directly.

Find a Point in the Characteristic with a Precisely Known State of Charge Via a Virtual Open Circuit Voltage Made Up of DC Resistance and Open Circuit Voltage In driving operation of the motor vehicle having the circuit 2, the internal resistance of the at least one battery cell 1 or the traction battery 9 can be calculated, for example via Delta_U/Delta_I (R_calc), at suitable points, for example current zero crossing.

Once the internal resistance (R_calc) has been determined, a virtual open circuit voltage (vOCV) of the cell or battery can be back-calculated directly afterwards via the presently measured current and the measured voltage in conjunction with the determined internal resistance. Due to the hysteresis effects and the flat characteristic of a lithium iron phosphate cell, the vOCV cannot be converted directly into an SOC. However, it is possible to draw conclusions about distinctive points in the curve, which in turn correlate with a state of charge. In the example above (FIG. 4), this would be the inflection at 90% or the rise at 20% SOC. Similarly to FIG. 1, the aging factor can now also be calculated here.

Reliably Determine the State of Charge Via a Distinctive Point in the Impedance

Distinctive points in the real or, in particular, imaginary part of the impedance arise due to phase transitions in the active material (for example in the calibration point based on C1). If such points are known from the cell measurement and are stable over the service life, they can be used directly as a reference point or calibration point for the state of charge. Since the state of charge is known via the jump in the imaginary part and the resistance is known via the measurement of the impedance, the change in comparison to the map data can be determined here. To improve the accuracy, instead of the correction using the measured impedance, the aging factor can also be determined via the DC resistance, if one could presently be calculated (see FIG. 1).

Overall, the examples show how an impedance-based method for the SOC determination of lithium iron phosphate batteries/cells can be provided.

The invention claimed is:

1. A method for determining a state of charge of at least one battery cell, comprising:
generating an alternating current pulse in a circuit connected to the at least one battery cell,
determining an impedance of the at least one battery cell on the basis of the alternating current pulse, and
determining the state of charge by comparing the impedance to predefined map data, wherein a relationship between the impedance and the state of charge of the at least one battery cell is determined from the predefined map data;
wherein the predetermined map data define at least one calibration point within a curve of an imaginary part of the impedance, wherein an additional detection of the state of charge by current integration is calibrated when the calibration point is exceeded.

2. The method as claimed in claim 1, wherein a real part of the impedance is compared to real part data, wherein the real part data are part of the map data and wherein a respective value for the state of charge of the at least one battery cell is assigned to multiple values for the real part of the impedance by the real part data.

3. The method as claimed in claim 2, wherein an imaginary part of the impedance is compared to imaginary part data, wherein the imaginary part data are part of the map data and wherein a respective value for the state of charge of the at least one battery cell is assigned to multiple values for the imaginary part of the impedance by the imaginary part data.

4. The method as claimed in claim 2, wherein an equivalent circuit diagram of the at least one battery cell is used to determine the impedance, which comprises a parallel connection of a capacitor (C1) and a first resistor (R1) and a second resistor (Ri) in series with said parallel connection.

5. The method as claimed in claim 2, wherein the impedance is compared to aging map data in addition to the map data, wherein the aging map data indicate a change in the relationship between the impedance and the state of charge due to aging and/or the number of cycles of the at least one battery cell.

6. The method as claimed in claim 1, wherein an imaginary part of the impedance is compared to imaginary part data, wherein the imaginary part data are part of the map data and wherein a respective value for the state of charge of the at least one battery cell is assigned to multiple values for the imaginary part of the impedance by the imaginary part data.

7. The method as claimed in claim 6, wherein an equivalent circuit diagram of the at least one battery cell is used to determine the impedance, which comprises a parallel connection of a capacitor (C1) and a first resistor (R1) and a second resistor (Ri) in series with said parallel connection.

8. The method as claimed in claim 6, wherein the impedance is compared to aging map data in addition to the map data, wherein the aging map data indicate a change in the relationship between the impedance and the state of charge due to aging and/or the number of cycles of the at least one battery cell.

9. The method as claimed in claim 1, wherein an equivalent circuit diagram of the at least one battery cell is used to determine the impedance, which comprises a parallel connection of a capacitor (C1) and a first resistor (R1) and a second resistor (Ri) in series with said parallel connection.

10. The method as claimed in claim 9, wherein a local or absolute maximum of an electrical capacitance C of the capacitor (C1) in the equivalent circuit diagram, is used as the at least one calibration point, wherein the local or absolute maximum of the capacitance (C1) is at between 70% and 90% state of charge of the at least one battery cell.

11. The method as claimed in claim 1, wherein the impedance is compared to aging map data in addition to the map data, wherein the aging map data indicate a change in the relationship between the impedance and the state of charge due to aging and/or the number of cycles of the at least one battery cell.

12. The method as claimed in claim 11, wherein the aging map data are derived from a direct current resistance of the at least one battery cell.

13. The method as claimed in claim 12, wherein based on the direct current resistance, a temperature-dependent and/or state-of-charge-dependent characteristic map can be determined which, as part of the aging map data, indicates the change in the relationship between the impedance and the state of charge.

14. A control device for determining a state of charge of at least one battery cell, comprising:
- an output unit for outputting a command signal for generating an alternating current pulse in a circuit connected to the at least one battery cell and/or a detection unit for detecting the alternating current pulse in the circuit, and
- a determination unit for determining an impedance of the at least one battery cell on the basis of the alternating current pulse, wherein the control device is designed to determine the state of charge by comparing the impedance to predefined map data, wherein a relationship between the impedance and the state of charge of the at least one battery cell is determined from the predefined map data, wherein the predetermined map data define at least one calibration point within a curve of an imaginary part of the impedance, wherein an additional detection of the state of charge by current integration is calibrated when the calibration point is exceeded.

15. A motor vehicle, comprising:
- a control device as claimed in claim 14,
- the at least one battery cell,
- the circuit connected to the at least one battery cell, and
- an electrical load which is designed to generate the alternating current pulse in the circuit connected to the at least one battery cell in response to the command signal.

16. The motor vehicle as claimed in claim 15, wherein the at least one battery cell is configured as a lithium iron phosphate cell.

* * * * *